(12) United States Patent
Lee et al.

(10) Patent No.: US 7,079,424 B1
(45) Date of Patent: Jul. 18, 2006

(54) METHODS AND SYSTEMS FOR REDUCING ERASE TIMES IN FLASH MEMORY DEVICES

(75) Inventors: Sungchul Lee, Cupertino, CA (US); Sheunghee Park, Pleasanton, CA (US); Yue-Song He, San Jose, CA (US); Ming Sang Kwan, San Leandro, CA (US)

(73) Assignee: Spansion L.L.C., Sunnyvale, CA (US)

( * ) Notice: Subject to any disclaimer, the term of this patent is extended or adjusted under 35 U.S.C. 154(b) by 0 days.

(21) Appl. No.: 10/945,914

(22) Filed: Sep. 22, 2004

(51) Int. Cl.
*G11C 11/34* (2006.01)

(52) U.S. Cl. ............................. 365/185.29; 365/185.24

(58) Field of Classification Search ........... 365/185.29, 365/185.24
See application file for complete search history.

(56) References Cited

U.S. PATENT DOCUMENTS

| | | | |
|---|---|---|---|
| 5,732,019 A * | 3/1998 | Urai | 365/185.24 |
| 5,751,636 A * | 5/1998 | Naruke et al. | 365/185.29 |
| 6,040,996 A * | 3/2000 | Kong | 365/185.19 |
| 6,252,803 B1* | 6/2001 | Fastow et al. | 365/185.22 |
| 6,504,765 B1* | 1/2003 | Joo | 365/185.29 |
| 6,507,522 B1* | 1/2003 | Lee et al. | 365/185.3 |
| 6,735,114 B1* | 5/2004 | Hamilton et al. | 365/185.03 |
| 6,778,443 B1* | 8/2004 | Shiga et al. | 365/185.33 |
| 6,834,012 B1* | 12/2004 | He et al. | 365/185.18 |
| 2004/0233134 A1* | 11/2004 | Shindo et al. | 345/63 |

* cited by examiner

*Primary Examiner*—Michael Tran
(74) *Attorney, Agent, or Firm*—Harrity Snyder, L.L.P.

(57) ABSTRACT

A method is provided for erasing a memory cell having a substrate, a control gate, a floating gate, a source region and a drain region. The method includes pre-programming the memory cell to raise a threshold voltage of the memory cell to a first predetermined level, wherein pre-programming the memory cell does not include a verification process for ensuring that the threshold voltage of the memory cell has been raised to the first predetermined level. The memory cell may be erased to lower the threshold voltage of the memory cell to a second predetermined level.

18 Claims, 5 Drawing Sheets

METHODS AND SYSTEMS FOR REDUCING ERASE TIMES IN FLASH MEMORY DEVICES

TECHNICAL FIELD

The present invention relates generally to memory devices. The present invention has particular applicability to non-volatile flash memory cells in electrically erasable and programmable memory devices.

BACKGROUND ART

A flash or block erase Electrically Erasable Programmable Read-Only Memory (Flash EEPROM) device includes an array of cells that can be independently programmed and read. The size of each cell and thereby the memory device are made small by omitting transistors known as select transistors that enable the cells to be erased independently. As a result, a group of the cells must be erased together as a block.

A flash memory device of this type includes individual Metal-Oxide-Semiconductor Field Effect Transistor (MOSFET) memory cells, each of which includes a source, a drain, a floating gate and a control gate to which various voltages are applied to thereby program the cell with a binary 1 or 0, to read the cell, to erase all or some of the cells as a block, to verify that the cell is erased or to verify that the cell is not over-erased.

Memory cells in a flash memory device are typically connected in an array of rows and columns, with the control gates of the cells in a row being connected to a respective word line and the drains of the cells in a column being connected to a respective bit line. The sources of all the cells may be connected together.

A cell is typically programmed by applying a voltage to the control gate, applying a voltage to the drain and grounding the source. A cell is typically read by applying a voltage to the word line to which the control gate of the cell is connected, applying a voltage to the bit line to which the drain of the cell is connected, grounding the source, and sensing the bit line current. If the cell is programmed and the threshold voltage is relatively high, the bit line current will be zero or nearly zero. If the cell is not programmed or erased, the threshold voltage will be relatively low, the control gate voltage will enhance the channel, and the bit line current will be relatively high.

A cell can be erased in several ways. In one arrangement, a cell is erased by applying a voltage to the P-well (substrate) and a negative voltage to the control gate, while allowing the source/drain to float. In another arrangement, a cell may be erased by applying a relatively high voltage to the source, grounding the control gate and allowing the drain to float. In yet another arrangement, the cell is erased by applying a negative voltage to the control gate, applying a voltage to the source and allowing the drain to float. These applied voltages cause the electrons that were injected into the floating gate during programming to undergo Fowler-Nordheim tunneling from the floating gate through the thin tunnel oxide layer to either the source or the substrate (P-well) depending on the type of erase being performed.

DISCLOSURE OF THE INVENTION

Advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one implementation consistent with principles of the invention, a method is provided for erasing a memory cell having a control gate and a floating gate formed over a substrate, a source region and a drain region. The method includes pre-programming the memory cell to raise a threshold voltage of the memory cell to a first predetermined level, wherein pre-programming the memory cell does not include a verification process for ensuring that the threshold voltage of the memory cell has been raised to the first predetermined level. The memory cell may be erased to lower the threshold voltage of the memory cell to a second predetermined level.

According to another aspect of the present invention, a method is provided for erasing a memory cell having a control gate, a floating gate, a source region and a drain region. The method includes applying a voltage to the substrate of the memory cell. An erase voltage is initializing to a first voltage. A first number of pulses is applied to the control gate of the memory cell at the erase voltage. The erase voltage is incremented by a predetermined voltage. The first number of pulses is applied at the incremented voltage. The steps of incrementing and applying are repeating until a triggering event. A second number of pulses is applied to the control gate after the triggering event. The erase voltage is incremented after the triggering event by a predetermined voltage. The second number of pulses is applied after the triggering event at the incremented voltage. The steps of incrementing and applying after the triggering event are repeated until the erase voltage reaches a third voltage.

According to still another aspect of the invention, a method is provided for erasing a memory cell having a substrate, a control gate, a floating gate, a source region and a drain region. The method includes applying a voltage to the substrate. An erase pulse is applied to the control gate, wherein the erase pulse includes a first interval portion having a first ramp rate associated with a voltage of the erase pulse and a second interval portion having a second ramp rate associated with a voltage of the erase pulse, the first ramp rate being different from the second ramp rate.

According to yet another aspect of the invention, a memory device is provided including a memory cell, the memory cell including a substrate, a control gate, a floating gate, a source region and a drain region. The memory device includes means for pre-programming the memory cell to raise a threshold voltage of the memory cell to a first predetermined level, wherein pre-programming the memory cell does not include a verification process for ensuring that the threshold voltage of the memory cell has been raised to the first predetermined level. Means are provided for erasing the memory cell to lower the threshold voltage of the memory cell to a second predetermined level.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide a method for erasing non-volatile memory devices, such as flash EEPROM devices. The method includes pre-programming the memory cell to raise a threshold voltage of the memory cell to a first predetermined level, wherein pre-programming the memory cell does not include a pre-program verification process for ensuring that the threshold voltage of the memory cell has been raised to the first predetermined level. The memory cell may be erased to lower the threshold voltage of the memory cell to a second predetermined level.

Figure 1:
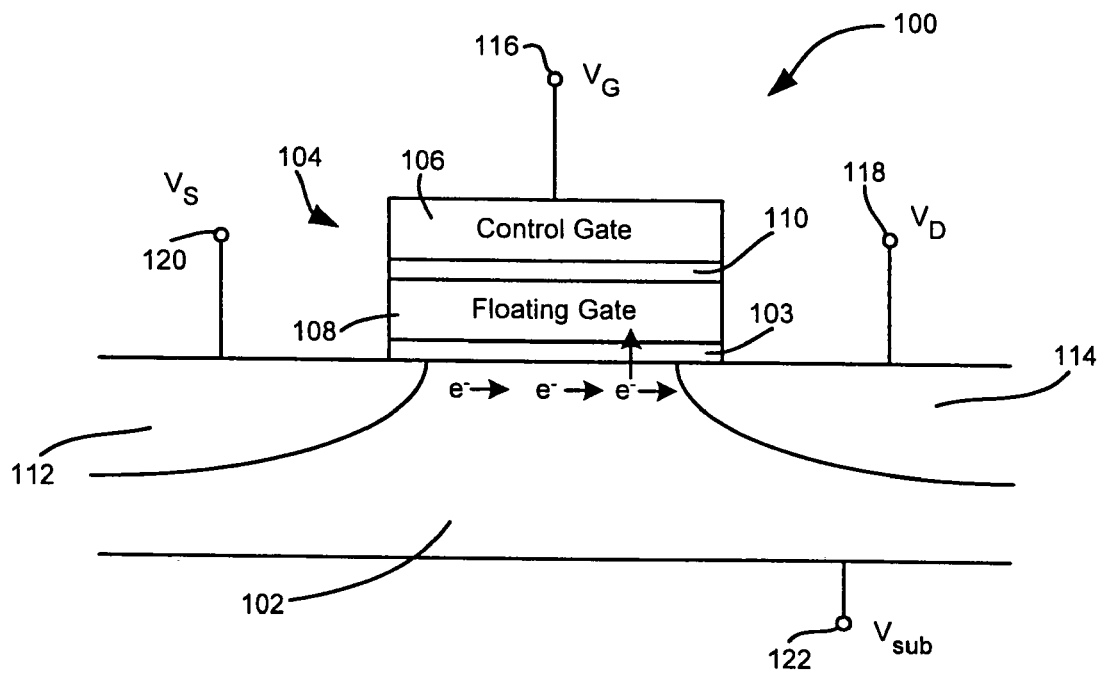
FIG. 1 is a schematic cross-section of an exemplary flash memory cell 100 formed in accordance with an embodiment of the present invention.

FIG. 1 illustrates a schematic cross-section of an exemplary flash memory cell 100 formed in accordance with an embodiment of the present invention. Referring to FIG. 1, memory cell 100 may include a silicon substrate 102, an oxide layer 103 and a stacked gate structure 104 including a control gate 106 and a floating gate 108 separated by a dielectric layer 110.

In one embodiment, silicon substrate 102 may include a p-type substrate. In another embodiment, silicon substrate 102 may include an n-type substrate. Memory cell 100 may include a pair of doped regions 112 and 114 formed in silicon substrate 102. Doped regions 112 and 114 may include $n^+$ type doped regions for a p-type substrate 102. Doped region 112 may function as a source region and doped region 114 may function as a drain region for memory cell 100. Dielectric layer 110 may include silicon dioxide. In one implementation, oxide layer 103 may be referred to as a tunnel oxide layer.

When memory cell 100 is undergoing an erase in accordance with one implementation consistent with the present invention, a voltage $V_G$ may be applied to the control gate 106 via a terminal 116, a voltage $V_D$ may be applied to drain region 114 via the terminal 118, and a voltage $V_S$ may be applied to source region 112 via terminal 120. A voltage $V_{sub}$ may be applied to the substrate or p-well 102 via terminal 122.

Figure 2:
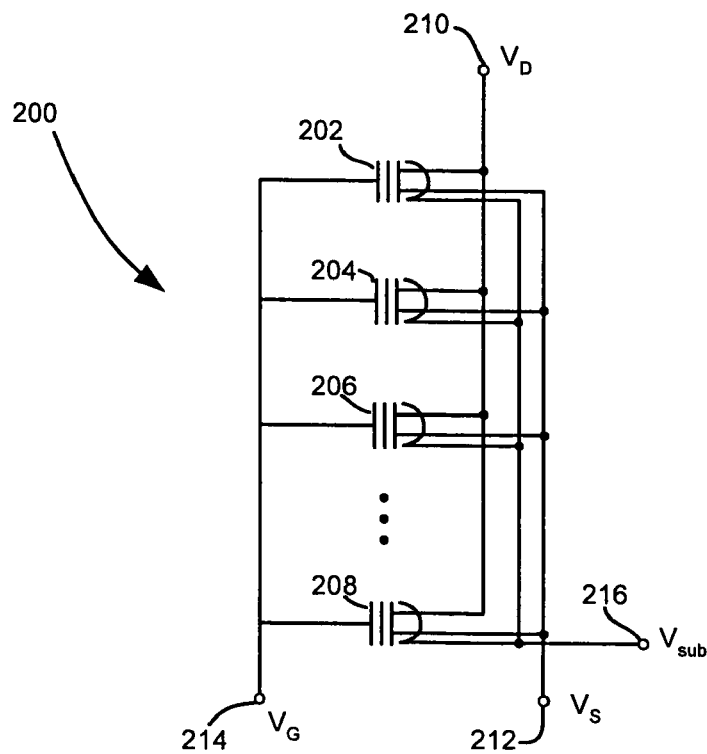
FIG. 2 is a is a simplified electrical schematic diagram of a column of flash EEPROM cells undergoing an erase operation.

FIG. 2 is a simplified electrical schematic diagram of a column 200 of flash EEPROM cells 202, 204, 206 and 208 showing erase voltages applied to the cell terminals in accordance with one implementation of the present invention. A bit line voltage $V_D$ may be applied to a common drain terminal 210, a source voltage $V_S$ may be applied to a common source terminal 212. A control gate voltage $V_G$ may also be applied to word line terminal 214 of each cell in column 200. A voltage $V_{sub}$ may also be applied to a common substrate terminal 216. Although in the erase operation each control gate in cells 202, 204, 206 and 208 may be connected to a common word line terminal, it should be understood that alternate operations such as read and program result in the application of individual voltages to word lines of particular cells.

In accordance with one implementation consistent with principles of the invention, cells 202, 204, 206 and 208 may be erased by applying a positive voltage $V_{sub}$ to substrate terminal 216, and a negative voltage $V_G$ to control gate terminal 214. Terminals 210 and 212 are floated, meaning that no voltage is applied to them. The applied voltages $V_{sub}$ and $V_G$ cause electrons previously injected into the floating gate during programming to undergo Fowler-Nordheim tunneling from the floating gate through the thin tunnel oxide layer to the substrate (P-well). Additional details regarding the erase process will be set forth in additional detail below.

Figure 3:
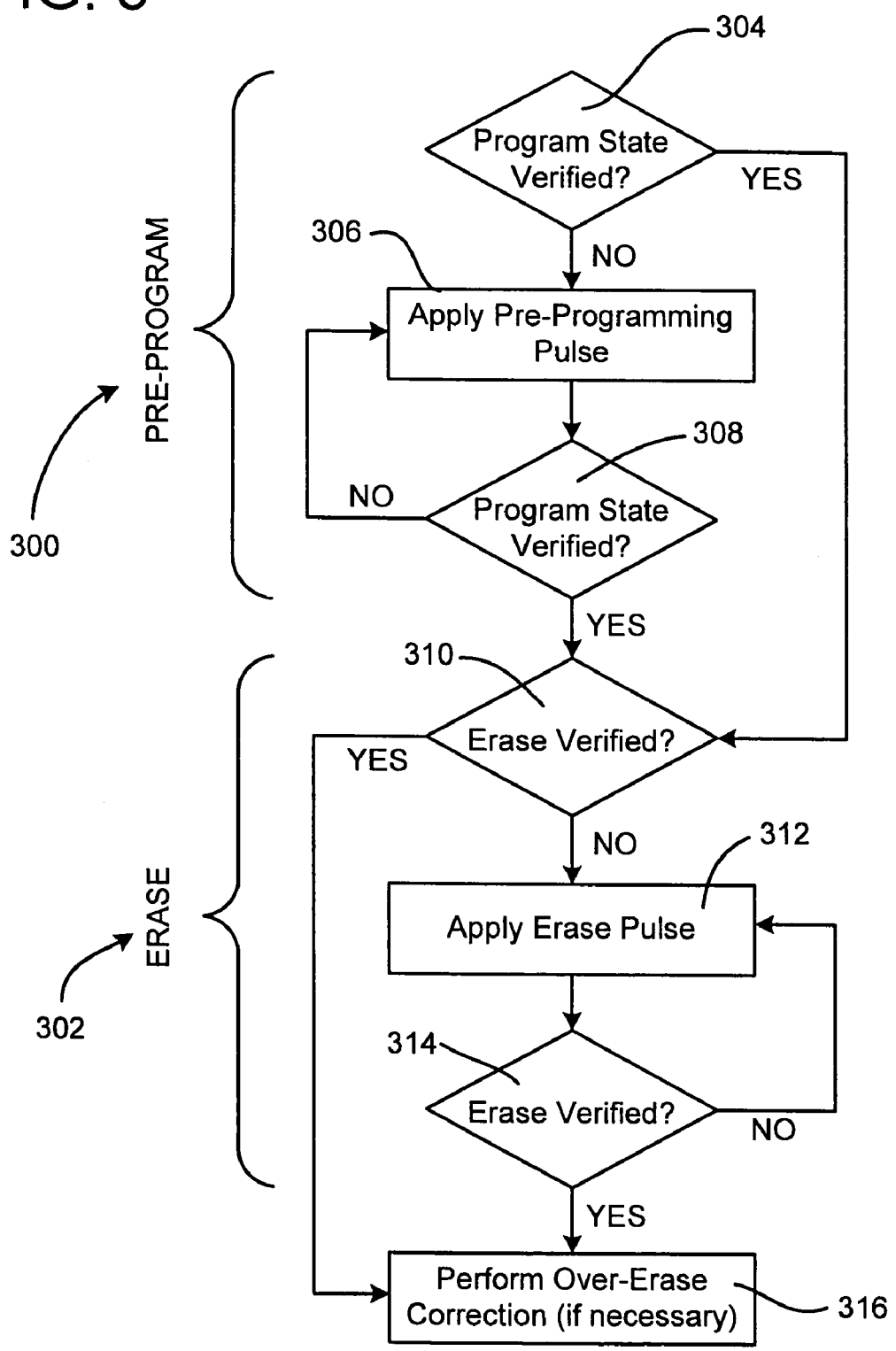
FIG. 3 is a is a flow diagram illustrating one implementation of a method for erasing memory cells in accordance with principles of the invention.

FIG. 3 is a flow diagram illustrating one implementation of a method for erasing memory cells in accordance with principles of the invention. Initially, prior to applying erase voltages to a memory cell, a pre-programming operation 300 may be performed to place each memory cell into a programmed state, thereby reducing the likelihood that cells will be over-erased during the erase process. Following pre-programming, an erase operation 302 is performed wherein all cells are erased by application of voltages as described above.

In one embodiment consistent with the invention pre-programming process 300 includes an initial program state verification (act 304) for determining whether all cells to be erased are in a programmed state. If all cells are not in a programmed state, a pre-programming voltage is applied to raise the threshold voltage of the cell prior to erasure (act 306). After application of the pre-programming voltage, another verification is performed (act 308). If the cells are still not all in the programmed state, the process returns to act 306 for another application of the pre-programming voltage. This process continues until a predetermined threshold voltage is achieved by all cells to be erased.

Following verification of a program state for all cells to be erased, the process proceeds to erase operation 302. Initially, an erase verification is performed (act 310) to determine if the threshold values for all cells have been reduced to a predetermined level. If so, the process proceeds to act 316 described in detail below. However, if the threshold values for all cells have not been reduced to a predetermined level, an erase voltage is applied to the cells (act 312) to lower the threshold voltage for the cells. In one implementation consistent with principles of the invention, the erase voltage may consist of an application of a constant low voltage to the substrate terminal of each cell and a negative word line voltage applied as a pulse to the control gate terminal of each cell, each word line pulse having a predetermined pulse width and voltage. Additional details regarding the erase voltage applied to the cells will be described in additional detail below.

Following application of an erase voltage, another erase verification is performed (act 314) to determine if the threshold values for all cells have been reduced to the desired level. If not, the process returns to act 312 where an additional erase voltage is applied. The erase process continues until all the threshold voltage for all cells has been reduced to a predetermined value.

Following erase verification, over-erase correction may be performed (act 316) if necessary to raise the threshold voltage for cells having a threshold value below a predetermined level. Floating gates of over-erased cells may be depleted of electrons and become positively charged. The over-erased cells then effectively function as depletion mode transistors that cannot be turned off by applying normal operating voltages to their control gates. Cells functioning as depletion mode transistors also introduce leakage current during subsequent program and read operations. By correcting for such over-erase conditions, leakage current is reduced.

In one implementation consistent with principles of the invention, over-erase correction may be performed by applying an over-erase correction voltage to all cells to be erased, thereby raising the threshold voltages for all cells above a predetermined over-erase limit. Alternatively, individual over-erased cells may be soft programmed to raise their threshold voltage without negatively programming non-over-erased cells. More specifically, over-erased memory cells may be individually identified. Following identification, suitable gate and drain voltages are applied to the identified to raise their threshold voltages above and over-erased state.

Figure 4:
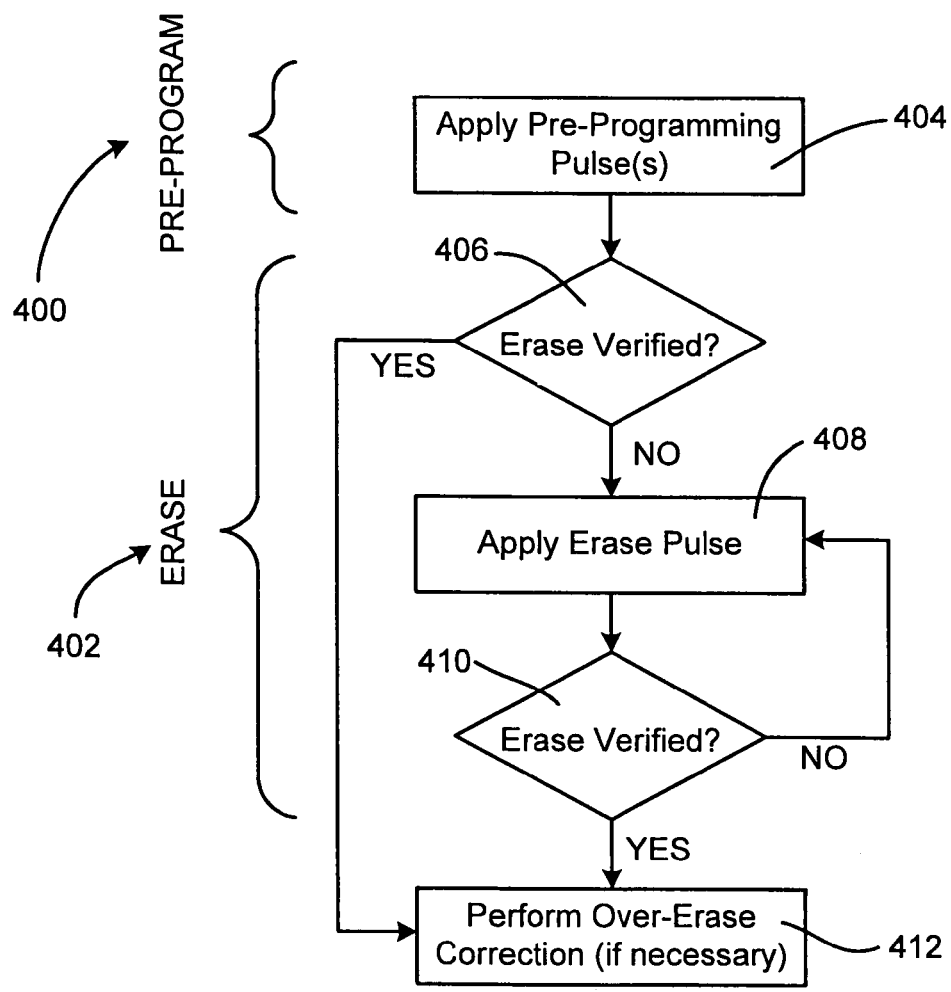
FIG. 4 is a flow diagram illustrating a second implementation of a method for erasing memory cells in accordance with principles of the invention.

FIG. 4 is a flow diagram illustrating a second implementation of a method for erasing memory cells in accordance with principles of the invention. As in the embodiment of FIG. 3, a pre-programming operation 400 may be performed prior to applying erase voltages to a memory cell, to place each memory cell into a programmed state, thereby reducing the likelihood that cells will be over-erased during the erase process. Following pre-programming, an erase operation 402 may be performed wherein all cells are erased by application of voltages as described above.

In one implementation consistent with the invention pre-programming process 400 conspicuously includes only applying an initial pre-programming voltage to raise the threshold voltage of the cell prior to erasure (act 404) without performing the verification acts 304 and 306 of FIG. 3. By removing the verification steps from the pre-programming operation, substantial erase time savings are recognized. In one specific implementation, pre-programming including verification takes approximately 400 ms, while pre-programming without verification takes only 100 ms, resulting in a 75% reduction in pre-programming time.

After application of the pre-programming voltage, the process proceeds to erase operation 402. Initially, an erase verification is performed (act 406) to determine if the threshold values for all cells have been reduced to a predetermined level. If so, the process proceeds to act 412 described in detail below. However, if the threshold values for all cells have not been reduced to a predetermined level, an erase voltage pulse is applied to the cells (act 408) to lower the threshold voltage for the cells. In one implementation consistent with principles of the invention, the erase voltage may consist of an application of a constant low voltage to the substrate terminal of each cell and a word line negative voltage applied as a pulse to the control gate terminal of each cell, each word line pulse having a predetermined pulse width and voltage. Additional details regarding the erase voltage applied to the cells will be described in additional detail below.

Following application of an erase voltage, another erase verification is performed (act 410) to determine if the threshold values for all cells have been reduced to the desired level. If not, the process returns to act 408 where an additional erase voltage pulse is applied. The erase process continues until all the threshold voltage for all cells has been reduced to a predetermined value.

Following erase verification, over-erase correction may be performed (act 412) to raise the threshold voltage for cells having a threshold value below a predetermined level. Again, suitable over-erase correction techniques may include applying an over-erase correction voltage to all cells to be erased, thereby raising the threshold voltages for all cells above a predetermined over-erase limit. Alternatively, individual over-erased cells may be soft programmed to raise their threshold voltage without adversely programming non-over-erased cells.

Figure 5:
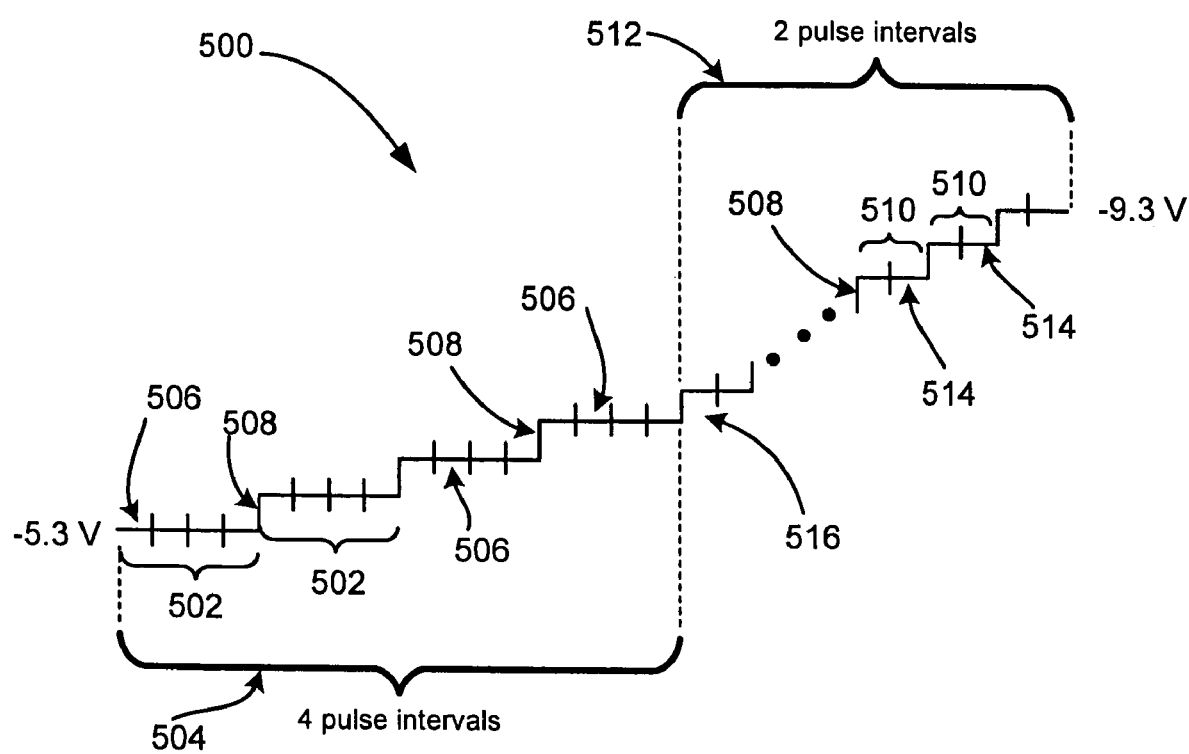
FIG. 5 is a graphical representation of one implementation of a variable ramp rate scheme for word line erase pulse voltages consistent with principles of the invention.

FIG. 5 is a graphical representation of one implementation of a variable ramp rate scheme 500 for word line erase pulse voltages consistent with principles of the invention. Variable ramp rate scheme 500 illustrates a series of word line erase pulses subjected to voltage increases 508 initially following each of a number of four pulse intervals 502, the series of intervals 502 being illustrated collectively as 504 in FIG. 5. As shown in FIG. 5, each interval 502 includes four individual pulses illustrated generally as 506, each of the pulses 506 being indicated by a vertical line during the pulse interval 502. Following a predetermined number of four pulse intervals 502, a predetermined number of two pulse intervals 510 in FIG. 5 may commence. The series of two pulse intervals 510 is illustrated collectively as 512 in FIG. 5. Similar to pulse interval 502, each two pulse interval 510 includes two individual pulses 514, each being represented by a vertical line. Modifying the ramp rate (i.e., the increases in voltages over time for the erase pulses) results in significant time reduction in that the desired threshold voltage is more quickly achieved by ramping the word line voltage to a higher voltage more quickly.

As described above, a word line erase voltage may be applied to the control gates of each cell as a pulse 506, 514 have a predetermined width (i.e., duration) and voltage. In one implementation, upon successive erase verify operations, word line erase pulses 506, 514 may be increased in magnitude from a low negative voltage to a high negative voltage on successive pulses or series of pulses. A triggering event 516 for shifting from four pulse intervals 502 to two pulse intervals 504 may include the application of a predetermined intermediate voltage. In an alternative embodiment, the triggering event may include an elapsed time period.

As shown in FIG. 5, the ramp rate for word line erase pulses 506, 514 may be modified midway through the ramp process from a series of four pulse intervals 502, illustrated collectively as 504 in FIG. 5 to a series of two pulse intervals 510, illustrated collectively as 512 in FIG. 5. In an exemplary implementation, word line erase pulses 506, 514 initially start at about −5.3 V and continue to about −9.3 V. In addition, each pulse 506, 512 may have a duration of about 1.2 ms. Following the completion of the four or two pulse intervals, the voltage may be increased by a predetermined voltage step. In one embodiment, the voltage step may be about 125 mV. In one exemplary implementation, 64 individual pulses 506 may be applied during the series 504 of four pulse intervals 502 (i.e., 16 series of 4 pulse intervals), resulting in a voltage change of 2 volts (V) from −5.3 V to −7.3 V. Subsequently, 32 individual pulses 514 may be applied during the series 512 of two pulse intervals 510 (i.e., 16 series of 2 pulse intervals), also resulting in a voltage change of 2 volts (V) from −7.3 V to −9.3V. By modifying the ramp rate of the word line erase pulse voltage, erase time is optimized while maintaining acceptable levels of oxide degradation. As is understood in the art, each erase pulse 506, 514 applied is typically followed up by an erase verification process as described in detail above, with respect to FIGS. 3 and 4 which may take, for example, an additional $4 \times 10^{-4}$ ms. Accordingly, reducing the number of pulses required to erase a cell reduces the erase time by not only reducing the number of pulses applied, but by also eliminating the overall number of verification steps associated with those pulses.

Figure 6:
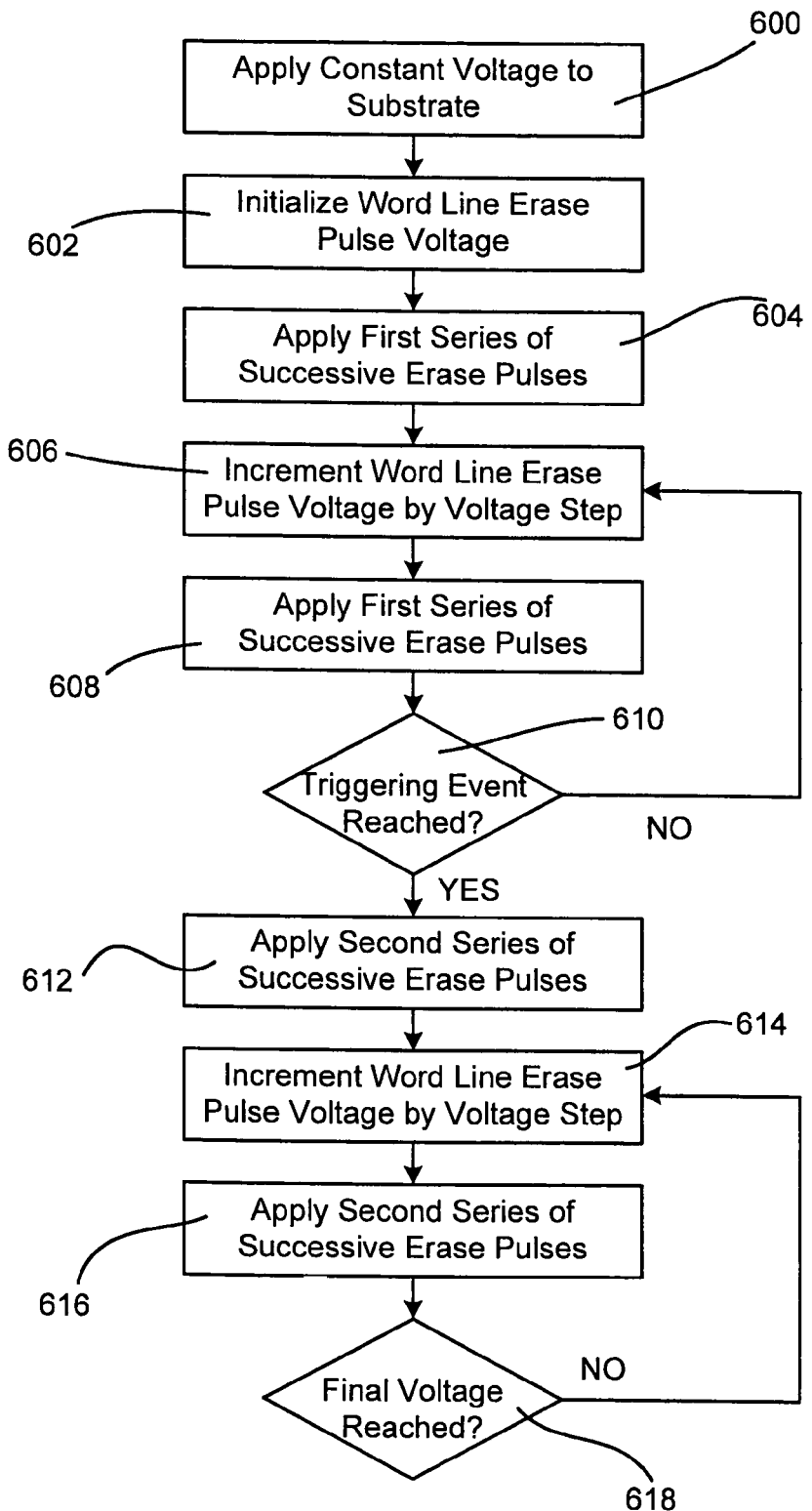
FIG. 6 is a flow diagram illustrating one implementation of a method for applying an erase voltage in accordance with principles of the invention.

FIG. 6 is a flow diagram illustrating one implementation of a method for applying an erase voltage in accordance with principles of the inventions. Initially, a constant voltage is applied to the p-well or substrate (act 600). Next, a word line erase pulse voltage is initialized to a first voltage (act 602). In one exemplary implementation, as described above, an initial voltage for the erase operation is about −5.3 V. A first series of successive erase pulses may then be applied to the control gate terminal at the word line erase pulse voltage (act 604). In one embodiment consistent with principles of the invention, the first series of successive erase pulses include four successive pulses. Next, the word line erase pulse voltage is incremented by a predetermined voltage step (act 606). In one implementation, as described above, the predetermined voltage step may be about 125 mV. The first series of successive erase pulses at the incremented voltage may then be applied to lower the threshold voltage of the memory cell (act 608).

It is next determined whether the word line erase pulse voltage has reached a triggering event (e.g., illustrated as 516 in FIG. 5) (act 610). In alternative embodiments, as described above, application of the word line erase pulses may shift from a first series of pulses to a second series of pulses based on either achieving a predetermined intermediate voltage or the elapsing of a predetermined time period. In an exemplary embodiment, the intermediate voltage may be about −7.3 V. Alternatively, for a time-base shift, the predetermined time may be about 76.8 ms. If the triggering event has not been reached, the process returns to act 606 to increment the applied word line erase pulse voltage.

However, if the intermediate voltage or predetermined time period has been reached, a second series of successive erase pulses (e.g., illustrated as 512 in FIG. 5) may then be applied to the control gate terminal at the word line erase pulse voltage (act 612). In one embodiment consistent with principles of the invention, the second series of successive erase pulses include two successive pulses. The word line erase pulse voltage is then incremented by the predetermined voltage step (act 614). The second series of successive erase pulses at the incremented voltage may then be applied to lower the threshold voltage of the memory cell (act 616). Next, it is next determined whether the word line erase pulse voltage has reached a final voltage (act 618). If the final voltage has not been reached, the process returns to act 614 to increment the applied word line erase pulse voltage. In one exemplary embodiment, as discussed above, the final word line erase pulse voltage may be about −9.3 V. By increasing the ramp rate for applying word line erase pulses, overall erase time is significantly reduced while cell integrity and reliability is maintained.

Implementations, consistent with principles of the invention allow for reduced erase time by eliminating a pre-programming verification process, while maintaining cell reliability. Additionally, cell erase time may be reduced by applying a variable ramp rate scheme to applied word line erase pulse voltages.

The foregoing is by way of example only and is not intended to be limiting. For example, the present invention may be practiced with any array of memory cells such as any non-volatile memory array. In addition, any specified material, any specified dimensions, and any specified voltage levels described herein are by way of example only. Other materials, dimensions, and voltage levels may be used for practicing the present invention, as would be apparent to one of ordinary skill in the art of non-volatile flash memory devices from the description herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise. The scope of the invention is defined by the claims and their equivalents.

What is claimed is:

1. A method for erasing a memory cell having a control gate and a floating gate formed over a substrate, a source region and a drain region, comprising:

pre-programming the memory cell to raise a threshold voltage of the memory cell to a first predetermined level, wherein pre-programming the memory cell does not include a verification process for ensuring that the threshold voltage of the memory cell has been raised to the first predetermined level;

erasing the memory cell by applying a voltage to the memory cell to lower the threshold voltage of the memory cell to a second predetermined level;

performing erase verification on the memory cell to determine whether the threshold voltage of the memory cell has been lowered to the second predetermined level; and applying a second erase voltage to the memory cell to lower the threshold voltage of the memory cell to the second predetermined level if it is determined during erase verification that the threshold voltage of the memory cell has not been lowered to the second predetermined level.

2. The method of claim 1, wherein pre-programming the memory cell further comprises:

applying a voltage to the memory cell to raise the threshold voltage of the memory cell to the first predetermined level.

3. The method of claim 1, wherein erasing the memory cell further comprises:

applying a constant voltage to the substrate of the memory cell; and applying erase pulses to the control gate of the memory cell, the erase pulses having an applied voltage and pulse width.

4. The method of claim 3, wherein the pulse width of the erase pulses is about 1.2 milliseconds.

5. The method of claim 3, wherein the applied voltage of the erase pulses includes a number of voltages ranging from a first voltage to a second voltage.

6. The method of claim 5, wherein the first voltage is about −5.3 volts and the second voltage is about −9.3 volts.

7. The method of claim 3, wherein applying erase pulses further comprises:
 initializing the applied voltage to a first voltage;
 applying a series of successive pulses at the first voltage;
 incrementing the applied voltage by a predetermined voltage;
 applying a series of successive pulses at the incremented voltage; and
 repeating the incrementing and applying until the applied voltage reaches a second voltage.

8. The method of claim 7, wherein the series of successive pulses includes four successive pulses.

9. The method of claim 7, wherein the predetermined voltage is about 125 millivolts.

10. The method of claim 3, wherein the applying erase pulses further comprises:
 initializing the applied voltage to a first voltage;
 applying a first series of successive pulses at the first voltage;
 incrementing the first voltage by a predetermined voltage;
 applying the first series of successive pulses at the incremented voltage;
 repeating the incrementing and applying until a triggering event;
 applying a second series of successive pulses after the triggering event at an applied voltage;
 incrementing the applied voltage by a predetermined voltage;
 applying the second series of successive pulses at the incremented voltage; and
 repeating the incrementing and applying after the triggering event until the applied voltage reaches a third voltage.

11. The method of claim 10, wherein the first series of successive pulses includes four successive pulses and the second series of successive pulses includes two successive pulses.

12. The method of claim 10, wherein the triggering event corresponds to reaching a second voltage.

13. The method of claim 12, wherein the second voltage is about −7.3 volts.

14. The method of claim 10, wherein the triggering event corresponds to expiration of a predetermined time period.

15. The method of claim 14, wherein the predetermined time period is about 77 milliseconds.

16. A method for erasing a memory cell having a substrate, a control gate, a floating, a source region and a drain region, comprising:
 a) applying a voltage to the substrate of the memory cell;
 b) initializing an erase voltage to a first voltage;
 c) applying a first number of pulses to the control gate of the memory cell at the erase voltage;
 d) incrementing the erase voltage by a predetermined voltage;
 e) applying the first number of pulses at the incremented erase voltage;
 f) repeating steps d and e until a triggering event;
 g) applying a second number of pulses to the control gate after the triggering event;
 h) incrementing the erase voltage after the triggering event by a predetermined voltage;
 i) applying the second number of pulses after the triggering event at the incremented voltage; and
 j) repeating steps h and i until the erase voltage reaches a third voltage.

17. A method for erasing a memory cell having a substrate, a control gate, a floating gate, a source region and a drain region, comprising:
 applying a voltage to the substrate;
 applying a first number of erase pulses to the control gate for a first duration; and
 applying a second number of erase pulses to the control gate for a second duration,
 wherein each of the first number and the second number of erase pulses includes a first interval portion having a first ramp rate associated with a voltage of the first number and second number of erase pulses and a second interval portion having a second ramp rate associated with a voltage of the first number and second number of erase pulses, the first ramp rate being different from the second ramp rate.

18. A memory device including a memory cell, the memory cell including a substrate, a control gate, a floating gate, a source region and a drain region, comprising:
 means for pre-programming the memory cell to raise a threshold voltage of the memory cell to a first predetermined level,
 wherein pre-programming the memory cell does not include a verification process for ensuring that the threshold voltage of the memory cell has been raised to the first predetermined level;
 means for erasing the memory cell to lower the threshold voltage of the memory cell to a second predetermined level;
 means for applying a voltage to the substrate; and
 means for applying a variable ramp rate erase pulse to the control gate,
 wherein the variable ramp rate erase pulse includes a first interval portion and a second interval portion.

* * * * *